United States Patent [19]
Ogawa et al.

[11] Patent Number: 5,260,675
[45] Date of Patent: Nov. 9, 1993

[54] LADDER-TYPE ELECTRIC FILTER DEVICE

[75] Inventors: Tatsuo Ogawa, Nagoya; Isao Shimizu, Yokosuka, both of Japan

[73] Assignees: NGK Spark Plug Co., Ltd.; Nippon Telegraph and Telephone Corporation, Japan

[21] Appl. No.: 865,866

[22] Filed: Apr. 9, 1992

[30] Foreign Application Priority Data

Apr. 12, 1991 [JP] Japan .................. 3-033539
Apr. 12, 1991 [JP] Japan .................. 3-033540

[51] Int. Cl.$^5$ .................................. H03H 9/00
[52] U.S. Cl. .................................. 333/189; 310/348
[58] Field of Search ............ 333/187, 188, 189, 190, 333/191, 192, 186; 310/348, 356, 357, 360, 325, 340, 351, 320, 359, 366, 369, 312, 367, 368

[56] References Cited

U.S. PATENT DOCUMENTS

| | | | |
|---|---|---|---|
| 2,969,512 | 1/1961 | Jaffe et al. | 333/187 |
| 3,299,301 | 1/1967 | Heilmann et al. | 333/187 |
| 3,316,510 | 4/1967 | Poschenrieder et al. | 333/187 |
| 3,321,648 | 5/1967 | Kowon | 333/187 |
| 4,353,045 | 10/1982 | Matsui et al. | 333/190 |
| 4,864,259 | 9/1989 | Takamoro et al. | 333/187 |
| 5,057,802 | 10/1991 | Ozeki et al. | 310/348 |
| 5,077,544 | 12/1991 | Ogawa et al. | 333/189 |
| 5,130,680 | 7/1992 | Nagai et al. | 310/312 |
| 5,151,672 | 9/1992 | Noto et al. | 333/189 |
| 5,168,253 | 12/1992 | Nakagawa et al. | 333/189 |

Primary Examiner—Raymond A. Nelli
Attorney, Agent, or Firm—Larson and Taylor

[57] ABSTRACT

A ladder-type electric filter device in which a casing is partitioned into two compartments, one for containing strip-shaped series piezoelectric resonator elements which are operated at a longitudinal oscillation mode and the other for containing square shaped parallel piezoelectric resonator elements which are operated at a peripheral oscillation mode, each of the series and parallel resonator elements is layered along the height of the casing. Alternatively, an input, output and grounding terminal plates for electrically connecting rectangular piezoelectric resonator elements operated at a longitudinal oscillation mode are integrally formed with a casing for containing the rectangular piezoelectric resonator elements.

11 Claims, 8 Drawing Sheets

LADDER-TYPE ELECTRIC FILTER DEVICE

BACKGROUND OF THE INVENTION

The present invention relates to a ladder-type electric filter device to be used for a filter circuit of a portable and mobile radio communication unit such as an automobile telephone set, in which it is mounted on a print-circuit board to form a desired filter circuit and comprises series and parallel resonators contained in a case as components of a unit filter circuit.

A conventional ladder-type electric filter device normally comprises series resonators one of whose terminal electrodes constitutes an input side, and parallel resonators one of whose terminal electrodes is grounded, the other terminal electrodes of the series and parallel resonators constituting an output side.

As a variety of such a ladder-type electric filter, one comprising square series and parallel resonators having a side approximately 5 mm long and utilizing a peripheral oscillation mode, and a filter comprising circular series and parallel resonators having a diameter of approximately 5 mm and utilizing a radial oscillation mode and designed to operate with a center frequency of 455 KHz are already known.

Recently, in an attempt of providing down-sized and lightweight radio communication units, there has been an increasing demand for thin ladder-type electric filters to be used for filter circuits. However, with a conventional filter comprising resonators which are as wide as approximately 5 mm, the overall height of the casing that contains them needs to be inevitably rather large and does not allow any further reduction.

Further, there has been proposed rectangular resonators utilizing a longitudinal oscillation mode to be used in place of square or circular series and parallel resonators. While the use of rectangular series and parallel resonators can reduce the height of the filter, it entails the necessity of preparing small rectangular input, output, grounding and connection terminal plates for holding the respective resonators. However, since the terminal plates have an extremely small thickness of less than 0.1 mm, the operation of handling such thin plates to fit them into a case is not an easy task, making the overall manufacturing cost of a filter rather high.

SUMMARY OF THE INVENTION

It is therefore an object of the present invention to provide a thin and down-sized ladder-type electric filter device capable of overcoming the disadvantages in the prior art.

Another object of the invention is to provide a thin and down-sized ladder-type electric filter device which can be easily assembled and has a simplified arrangement.

According to one aspect of the present invention, there is provided a ladder-type electric filter in which series and parallel piezoelectric resonator elements are contained in a casing to form a filter circuit unit, characterized in that each of the series piezoelectric resonator elements has a strip shape and operated at a longitudinal oscillation mode, each of the parallel piezoelectric resonator elements has a square shape and operated at a peripheral oscillation mode, the casing is partitioned into two compartments, one for containing the series piezoelectric resonator elements and the other for containing the parallel piezoelectric resonator elements, and each of the series and parallel resonator elements is layered along the height of the casing.

According to a second aspect of the present invention, there is provided a ladder-type electric filter device including series and parallel piezoelectric resonator elements each having a rectangular form and being operated at a longitudinal oscillation mode, input, output grounding and connecting rectangular terminal plates for electromechanically holding said piezoelectric resonator elements, and a casing for containing the rectangular series and parallel piezoelectric resonator elements and the respective terminal plates in a predetermined configuration, characterized in that the input, output and grounding terminal plates are arranged within and integrally formed with the casing so that they are rigidly fitted thereto, and each of the input, output and grounding terminal plates is provided with a connecting leg which is extended to the outside of the casing and is bent toward the bottom of the casing.

In the device according to the first or second aspect of the present invention, it is preferable that the series piezoelectric resonator elements have a main resonance frequency equal to the center frequency of the filter, and the parallel piezoelectric resonator elements have an anti-resonance frequency equal to the center frequency of the filter.

Preferably, each of the series piezoelectric resonator elements may have a thickness larger than and a surface area smaller than that of each parallel piezoelectric resonator element to reduce electrostatic capacity relative to that of the latter.

Alternatively, each of the series piezoelectric resonator elements may have a thickness equal to that of each parallel piezoelectric resonator element and may have a partial electrode on a portion of one side thereof.

The present invention will now be described by way of example with reference to the accompanying drawings:

DETAILED DESCRIPTION

Figure 1:
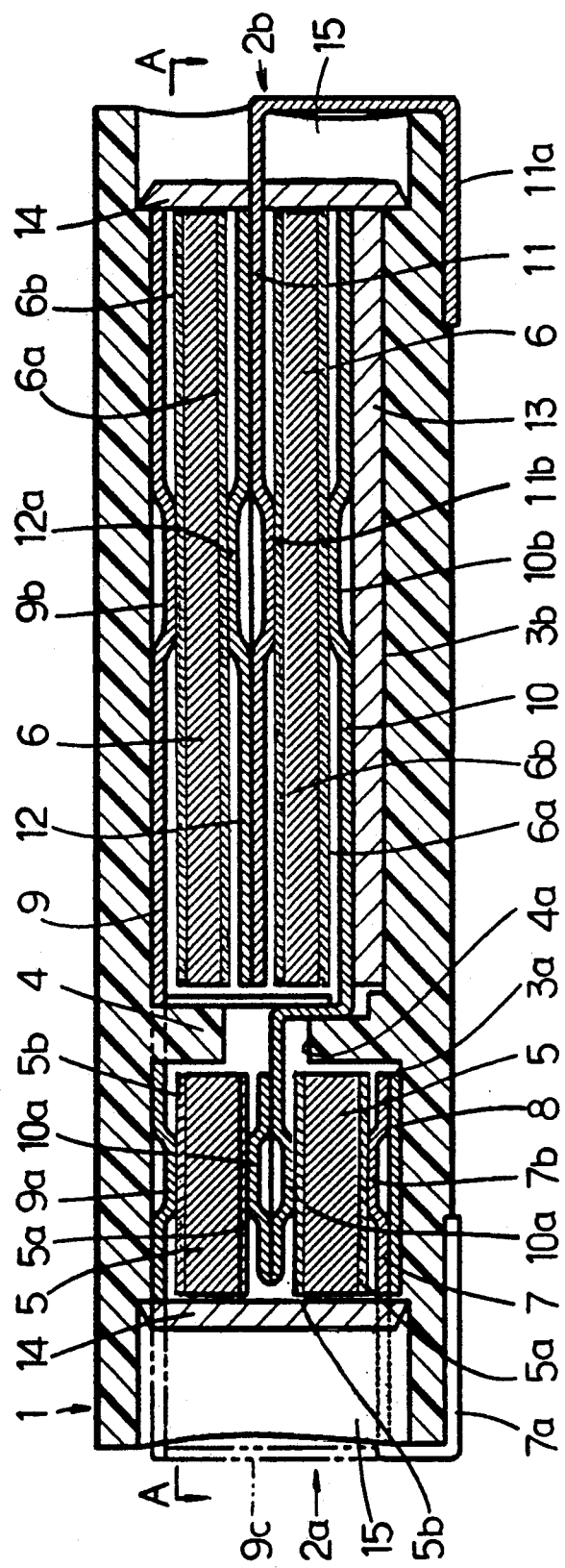
FIG. 1 is an enlarged longitudinal section schematically showing an embodiment of the ladder-type electric filter device according to the present invention.

Referring to FIGS. 1 to 5, there is shown a ladder-type electric filter device according to an embodiment of the present invention.

The reference numeral 1 denotes a thin cubic casing made of a synthetic resin material and having openings 2a and 2b. The casing 1 is divided into two compartments 3a and 3b by a partition 4 which is integrally formed with the casing 1 and has a through bore 4a.

Figure 2:
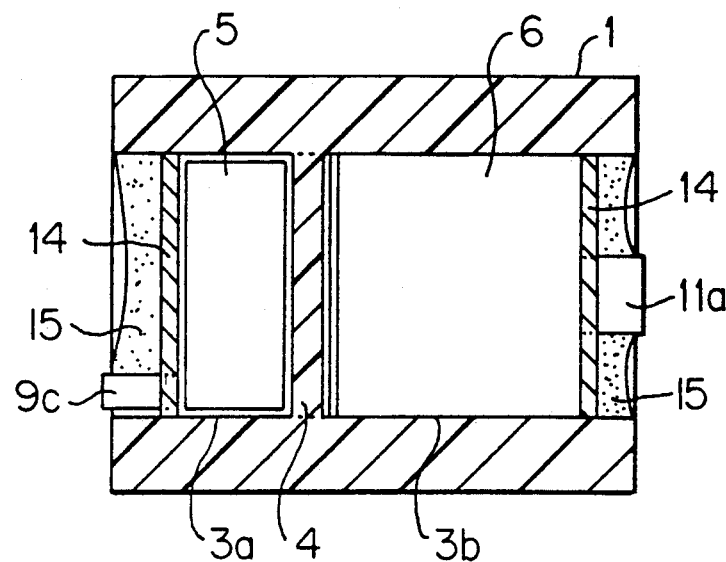
FIG. 2 is a sectional view cut along a line A—A of FIG. 1.

As shown in FIG. 2, one or front compartment 3a is rectangular with a relatively large width and a short length, and is designed to contain a pair of strip-shaped series piezoelectric resonator elements 5 and 5 in a configuration superimposed one above the other. The other or rear compartment 3b is square and designed to contain a pair of parallel piezoelectric resonator elements 6 and 6 in the similar configuration.

Figure 5:
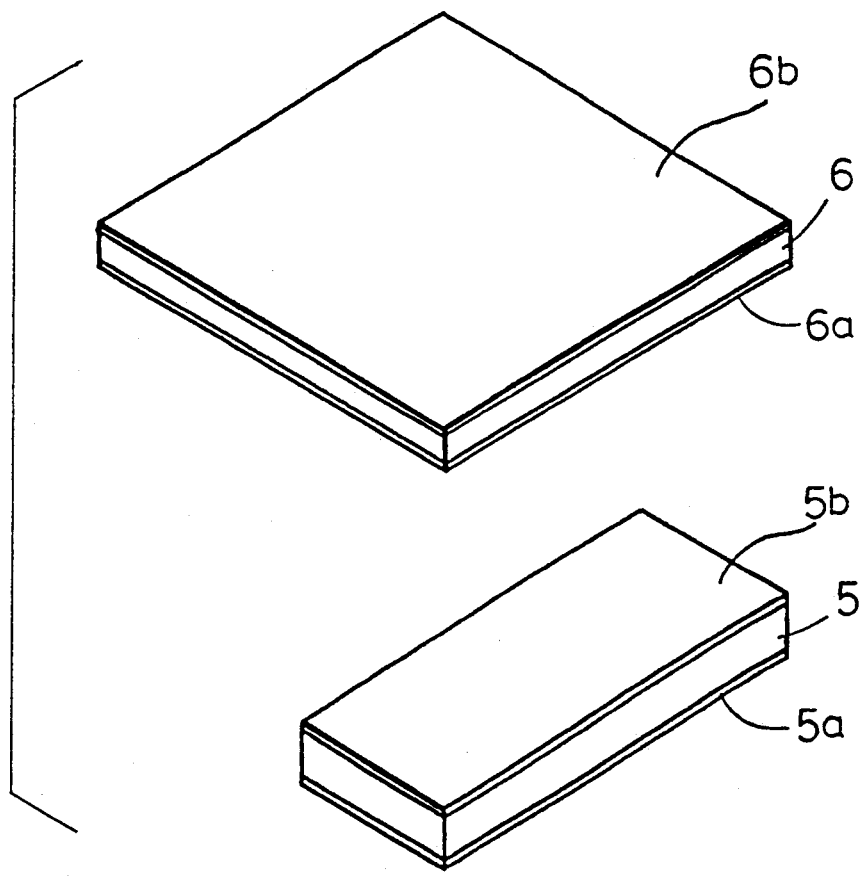
FIG. 5 is an enlarged perspective view showing the series and parallel piezoelectric resonator elements which are used in the ladder-type electric filter device of FIG. 1.

As shown in FIG. 5, the series piezoelectric resonator elements 5 and the parallel piezoelectric resonator elements 6 are provided with electrodes 5a, 5b, and 6a, 6b on the both sides thereof, respectively. In order that each series piezoelectric resonator element 5 has a electrostatic capacity smaller than that of each of the parallel piezoelectric resonator elements 6, the former has a thickness larger than that of the latter, and each of the parallel piezoelectric resonator elements is formed in a square shape so that each of the electrodes 6a and 6b thereon has a surface area greater than that of each of the series resonator elements 5.

Alternatively, a desired electrostatic capacity ratio may be obtained by providing a partial electrode on a portion of one side of each of the series resonator elements 5 and making each series resonator element 5 as thick as each parallel resonator element 6.

In the illustrated embodiment, for example, each of the series resonator elements 5 has a width, a length and a height of respectively 1.5 mm, 3.8 mm and 0.60 mm, while those of each of the parallel resonator elements 6 are 4.65 mm, 4.65 mm and 0.32 mm. The casing 1 in which these resonator elements 5 and 6 are contained is 8.5 mm long, 5.5 mm wide and 2.5 mm high.

Figure 4:
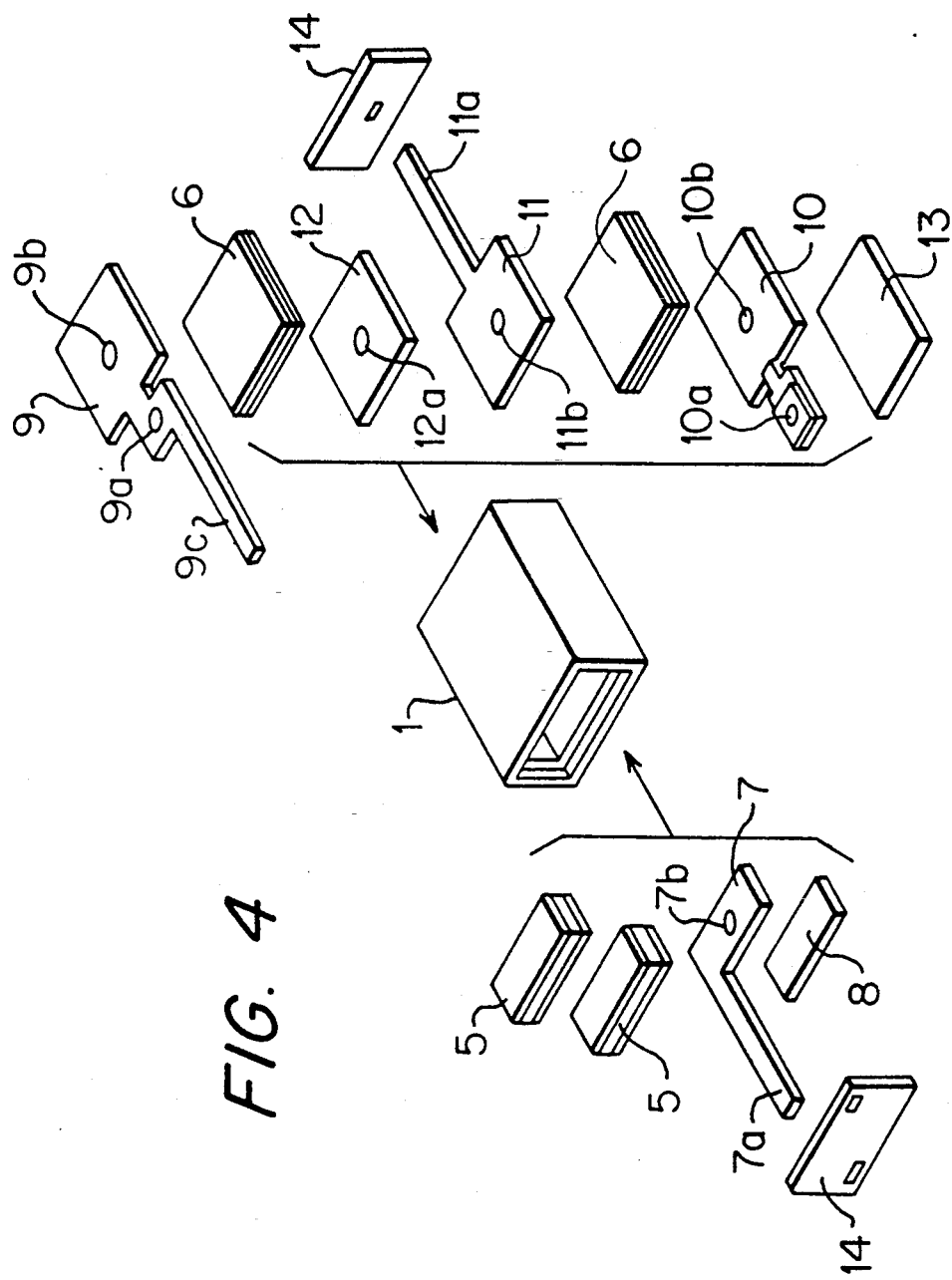
FIG. 4 is an exploded perspective view of the ladder-type electric filter device shown in FIG. 1.

As shown in FIGS. 1 and 4, an input terminal plate 7 is disposed between the electrode 5a on the lower surface of the lower series resonator element 5 and the inner bottom surface of the casing 1 with a buffer plate 8 inserted between the casing 1 and the input terminal 7. plate 7. The input terminal plate 7 is provided with a connecting leg 7a which is outwardly protruded through the opening 2a, and a circular arc-shaped protuberance 7b which abuts on the lower electrode 5a of the lower series resonator element 5 for securing an electric connection therebetween. An output terminal plate 9 is disposed along the upper inner wall of the casing 1 so that it runs through the partition 4 and the compartments 3a and 3b. As will be seen in FIG. 4, the output terminal plate 9 comprises a first portion being positioned in the front compartment 3a and having a circular arc-shaped protuberance 9a, a second portion being positioned in the rear compartment 3b and having a circular arc-shaped protuberance 9b, and a connecting leg 9c. The first portion of the output terminal plate 9 is positioned between the upper electrode 5b of the upper series piezoelectric resonator element 5 and the upper inner wall of the casing 1 so that the protuberance 9a comes into contact with the upper electrode 5b. The connecting leg 9c is outwardly protruded through the opening 2a.

The reference numeral 10 denotes a conductor plate which comprises a first folded portion to be positioned in the front compartment 3a, a second portion to be positioned in the rear compartment 3b, and a portion for connecting the first and second portions.

The first folded portion of the conductor plate 10 is disposed between the series piezoelectric resonator elements 5 and 5, and is provided with circular arc-shaped protuberances 10a on the both sides thereof. The protuberances 10a come into contact with the upper electrode 5b of the lower series resonator element 5 and the lower electrode 5a of the upper series resonator element 5, respectively. That is, the lower and upper series resonator elements 5 and 5 are connected to each other by the first folded portion of the conductor plate 10.

In the rear compartment 3b of the casing 1 there are contained two parallel piezoelectric resonator elements 6 and 6 between which a grounding plate 11 and a spacer plate 12 made of a suitable conducting material are disposed. The grounding plate 11 is provided with a connector leg 11a which is extended outwardly through the opening 2b of the casing 1, and a circular arc-shaped protuberance 11b which abuts on the upper electrode 6b of the lower parallel resonator element 6. The spacer plate 12 is superimposed on the grounding plate 11 and has a circular arc-shaped protuberance 12a which abuts on the lower electrode 6a of the upper parallel resonator element 6.

The second portion of the conductor plate 10 is positioned between the bottom of the rear compartment 3b and the lower parallel resonator element 6 with a buffer plate 13 placed between the bottom of the rear compartment 3b and the lower parallel resonator element 6. The protuberance 10b on the second portion of the conductor plate 10 comes into contact with the lower electrode 6a of the lower parallel resonator element 6, so that the lower electrode 6a is connected with the upper electrode 5b of the lower series resonator element 5 and the lower electrode 5a of the upper series resonator element 5 contained in the front compartment 3a by the conductor plate 10. The second portion of the output terminal plate 9 is positioned on the upper wall of the rear compartment 3b, and comes into contact with the upper electrode 6b of the upper parallel resonator element 6 via the protuberance 9b. Therefore, the output terminal plate 9 is arranged to connect the upper electrode 5b of the upper series resonator element 5 with that of the upper parallel resonator element 6.

Figure 3:
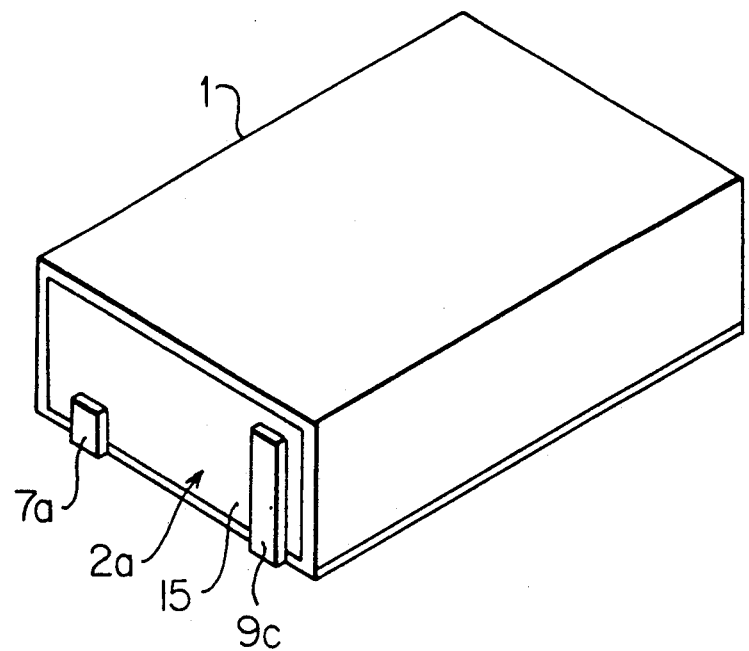
FIG. 3 is a perspective view of the ladder-type electric filter device shown in FIG. 1.

After placing the components in position in the casing 1, the openings 2a and 2b of the casing 1 are covered by respective sealing plates 14 and 14 through which the connecting legs 7a, 9c and 11a of the input and output terminal plates 7 and 9 and the grounding plate 11 are outwardly extended, respectively. Then, the remaining spaces above the sealing plates 14 and 14 are filled with respective filler members 15 and 15 made of an appropriate material such as epoxy resin to tightly seal the casing 1. The connecting legs 7a, 9c and 11a of the input and output terminal plates 7 and 9 and the grounding plate 11 are bent twice along the side of the openings 2a and 2b as shown in FIGS. 1 and 3 so that the free ends of these connecting legs terminate on the outer bottom surface of the casing 1 to complete assembling a ladder-type electric filter device according to the present invention.

With the ladder-type electric filter device as illustrated above, the series piezoelectric resonator elements 5 and 5 are strip-shaped and their main resonance frequency in the longitudinal oscillation mode is set to the center frequency of the filter device. On the other hand, each of the parallel piezoelectric resonator elements 6 and 6 has an anti-resonance frequency in the peripheral oscillation mode set to the center frequency of the filter device in a conventional manner. A desired unit filter circuit is thus constituted by these series and parallel resonators 5 and 6.

In the illustrated ladder-type electric filter device, the series resonator elements have dimensions by far smaller than those of a conventional square type arrangement because they are strip-shaped. Moreover, since the series resonator elements 5 and 5 and the parallel resonator elements 6 and 6 are separated by the partition 4 and arranged in two layers in the respective compartments 3a and 3b of the casing 1, the total number of resonator element layers is reduced to a half of that of a conventional arrangement. Consequently, the height of the casing 1 can be reduced to nearly a half of a conventional casing. Besides, since the surface area of each of the series resonator elements 5 and 5 is significantly reduced by utilizing the longitudinal oscillation mode, the overall dimensions of the casing can be remarkably reduced as compared with that of any conventional one.

Figure 10:
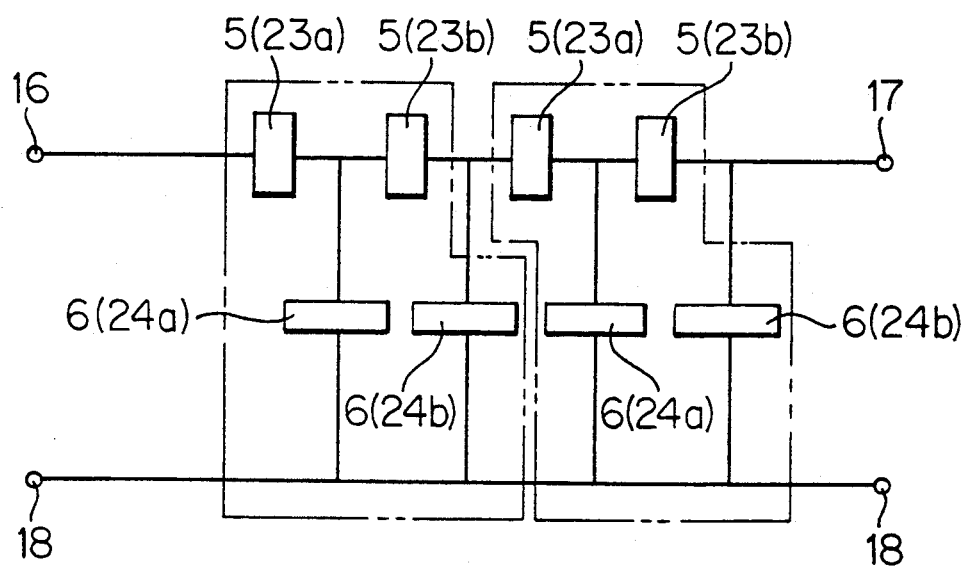
FIG. 10 is an equivalent circuit diagram of a filter circuit in which the filter device of the present invention is used.

The free ends of the connecting legs 7a, 9c and 11a of the input and output terminal plates 7 and 9 and the grounding plate 11 are exposed at the bottom of the casing 1, and these exposed free ends are soldered to respective conductors of a matching print-circuit board not shown to form a filter circuit as shown in FIG. 10 in which the series piezoelectric resonator elements 5 and 5 are connected in series with an input and output terminals 16 and 17 via the respective input and output terminal plates 7 and 9, while the parallel piezoelectric resonator elements 6 and 6 are connected in parallel with the grounding terminal 18. The illustrated filter circuit comprises two ladder-type electric filter devices having a similar configuration.

Figure 6:
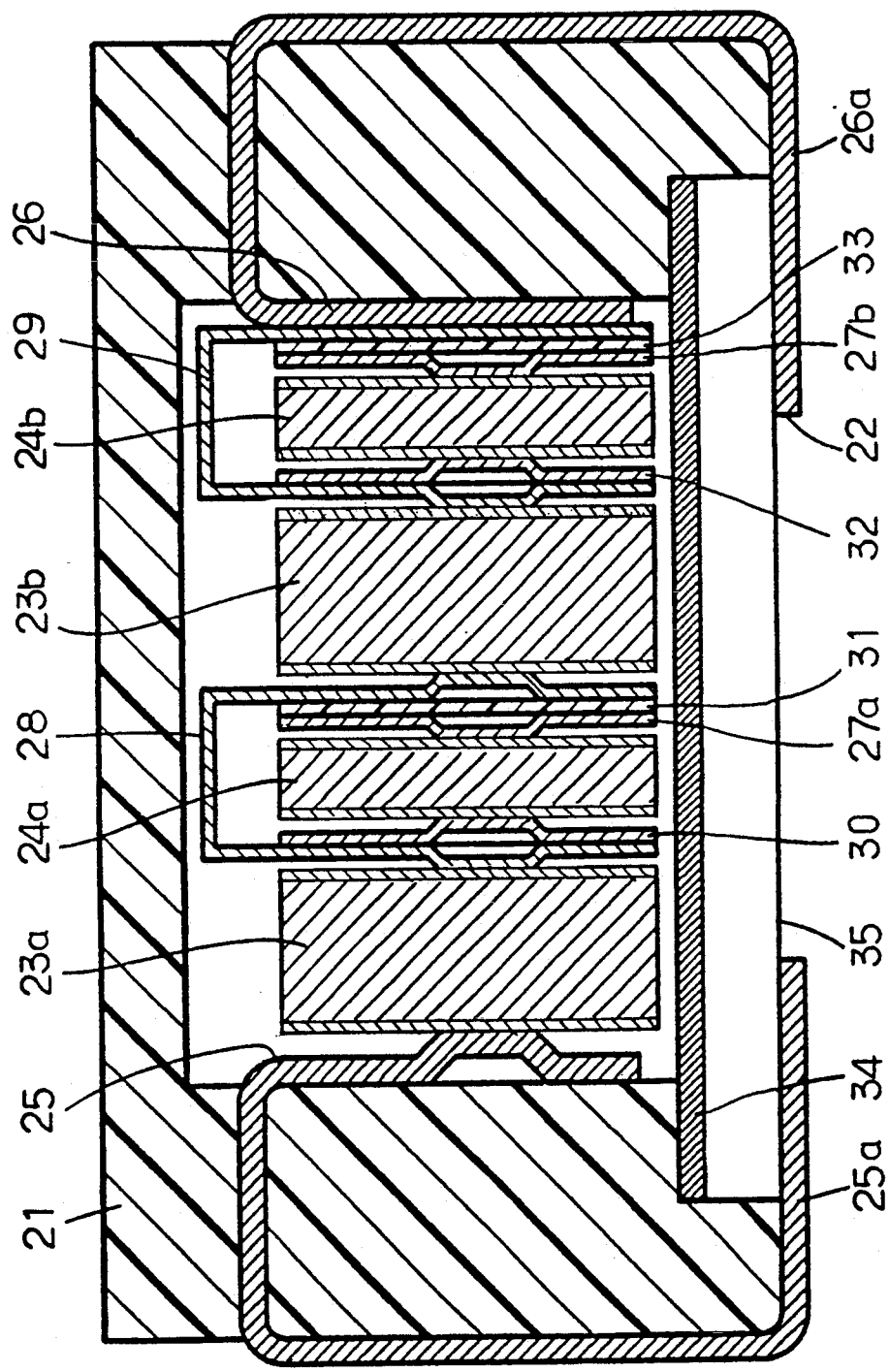
FIG. 6 is an enlarged longitudinal section schematically showing another embodiment of the ladder-type electric filter device according to the present invention.
Figure 7:
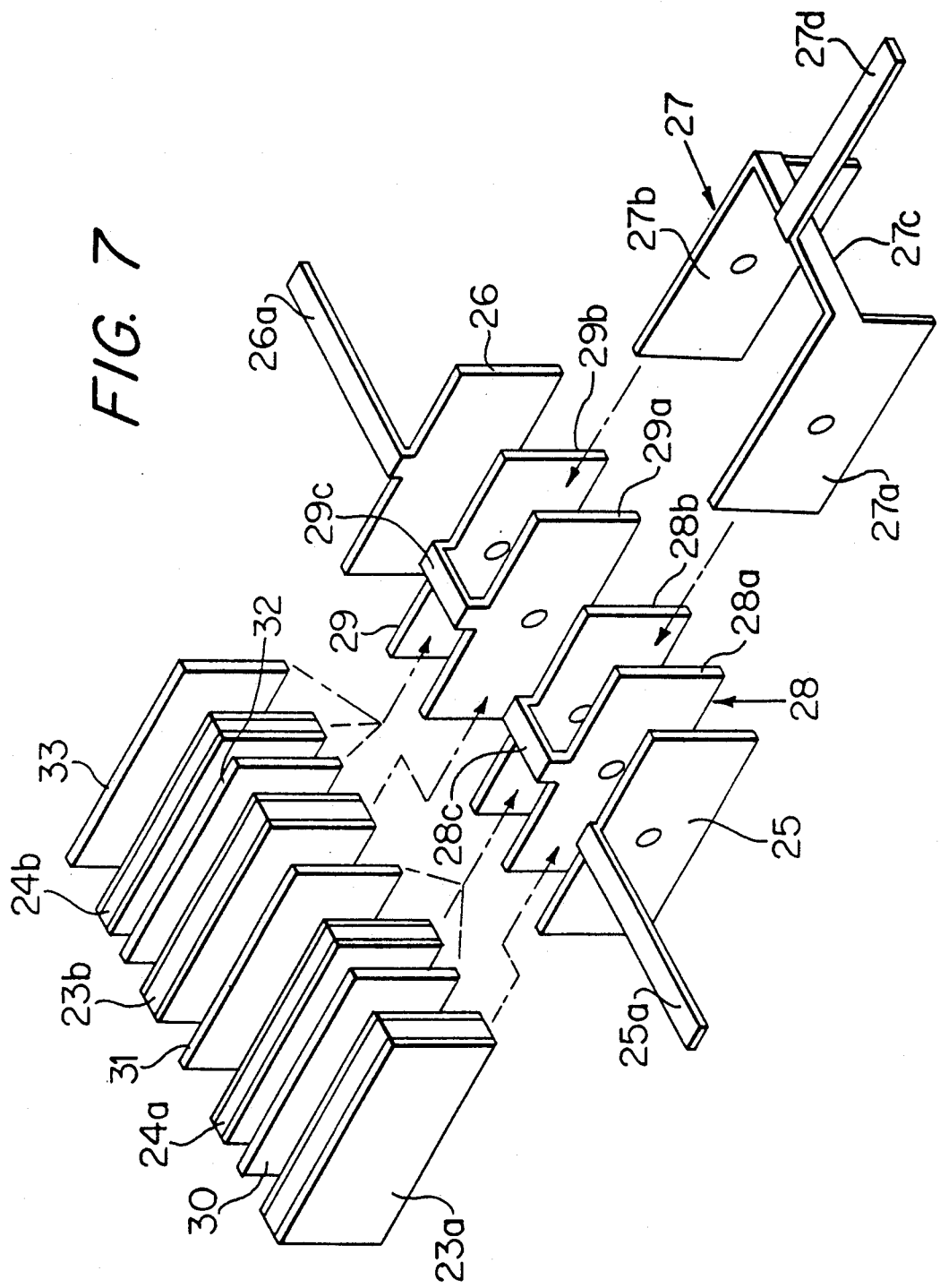
FIG. 7 is an exploded perspective view of the ladder-type electric filter device shown in FIG. 6, the casing being omitted.

FIGS. 6 to 9 illustrate another embodiment of the present invention in which the respective components are arranged vertically in a thin cubic casing 21 made of a synthetic resin material and having an opening 22 at the bottom thereof. The casing 21 is designed to contain alternately arranged rectangular series resonator elements 23a and 23b and parallel resonator elements 24a and 24b as well as an input terminal plate 25, an output terminal plate 26, a grounding terminal strip 27 and a pair of connecting terminal strips 28 and 29 to form a multi-layered structure as shown in FIG. 6.

The series resonator elements 23a and 23b are made thicker than the parallel resonator elements 24a and 24b in order to reduce their electrostatic capacity relative to that of the latter. Alternatively, a desired electrostatic capacitance ratio may be obtained by providing a partial electrode on a portion of a side of each series resonator element and making the series resonator elements 23a and 23b as thick as parallel resonator elements 24a and 24b.

With the illustrated embodiment each of the series resonator elements 23a and 23b has a width, a length and a height of respectively 1.5 mm, 3.8 mm and 0.60 mm, while those of each of the parallel resonator elements 24a and 24b are 1.5 mm, 3.8 mm and 0.30 mm, making the series resonator elements 23a and 23b and the parallel resonator elements 24a and 24b different only in height so that they present an identical plan view. The casing 21 has a square surface with four equal sides of 6.5 mm and a height of 2.5 mm.

The illustrated components will be assembled in a manner as described below in detail.

The input terminal plate 25 and the output terminal plate 26 are provided with connector legs 25a and 26a, respectively, extending laterally and outwardly from the respective upper edges. The grounding terminal strip 27 consists of a pair of terminal plates 27a and 27b physically and electrically connected to each other at the front edge by means of a connector 27c, from which a connector leg 27d is further forwardly extending. Each of the connecting terminal strips 28 and 29 is essentially constituted by a pair of connecting terminal plates 28a, 28b or 29a, 29b which are physically and electrically connected with each other at the upper edge by means of a connector 28c or 29c so that they present a U-shaped lateral view. Also, each of the terminal plates 25, 26, 27a, 27b, 28a, 28b, 29a and 29b has a rectangular form similar to that of the respective resonator elements.

Figure 8:
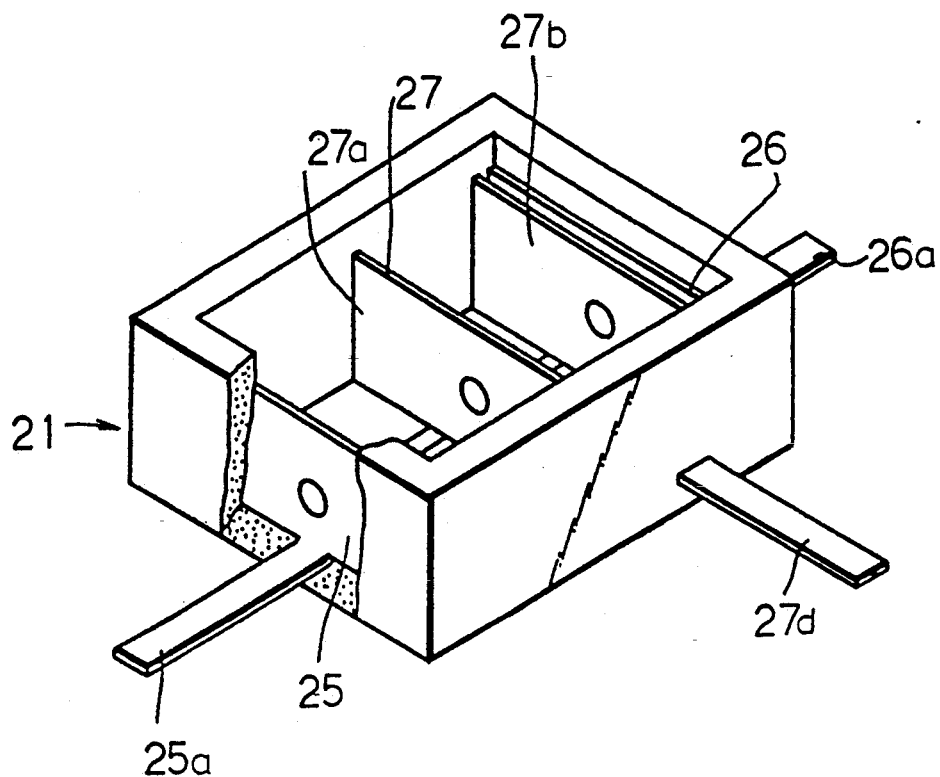
FIG. 8 is a partially cut-out perspective view of the embodiment of FIG. 6, showing the interior of the casing.
Figure 9:
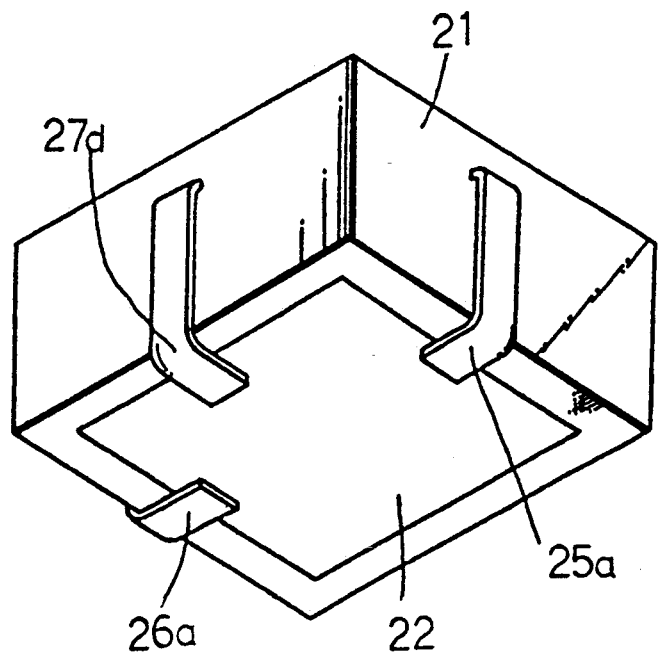
FIG. 9 is a perspective view of the ladder-type electric filter device shown in FIG. 6.

As shown in FIG. 8, the input terminal plate 25 is arranged along a lateral wall of the casing 21, the output terminal plate 26 arranged along the opposite lateral wall and the grounding terminal plate 27 arranged at the intermediate portion, and then these terminal plates are integrally formed with the casing 21 by means of an insertion molding, the connecting legs 25a, 26a and 27d being extended outwardly through the respective lateral walls of the casing 21.

Then, one of the series resonator elements 23a is disposed adjacent to the input terminal plate 25 in the casing 21 through the opening 22 and thereafter the connecting terminal strip 28 is placed in position. Then, the parallel resonator element 24a is disposed between the terminal plates 28a and 28b with another terminal plate 30 arranged between the terminal plate 28a and the parallel resonator element 24a, and thus one of the electrodes of the parallel resonator element 24a is connected to the terminal plates 28a via the terminal plate 30. The other electrode of the parallel resonator element 24a is connected to the terminal plate 27a of the grounding terminal strip 27 but is electrically insulated from the terminal plate 28b by means of an insulator plate 31 which is inserted between the terminal plate 27a and the terminal plate 28b. Then, the other series resonator element 23b is disposed adjacent to the terminal plate 28b and the connecting terminal strip 29 is disposed in position. Thereafter, the other parallel resonator element 24b is disposed between the terminal plates 29a and 29b of the connecting terminal strip 29 with a terminal plate 32 arranged between the terminal plate 29a and the parallel resonator element 24b. Thus one of the electrodes of the parallel resonator element 24b is connected to the terminal plates 29a via the terminal plate 32. The other electrode of the parallel resonator element 24b is connected to the terminal plate 27b of the grounding terminal strip 27 but is electrically insulated from the terminal plate 29b by means of an insulator plate 33 which is inserted between the terminal plate 27b and the terminal plate 29b. The respective connecting strips 28 and 29 are connected to the grounding terminal strip 27.

With the illustrated arrangement, the series resonator elements 23a and 23b are connected in series by means of the connecting terminal strips 28 and 29, and may be connected to an input and output terminals not shown of another ladder-type electric filter via the input and output terminal plates 25 and 26.

The parallel resonator element 24a arranged between the series resonator elements 23a and 23b has two surface electrodes one being connected to one of these series resonator elements 23a via the connecting terminal strip 28 and the other electrode connected to the grounding terminal strip 27. Similarly, one of the electrodes of the parallel resonator element 24b is connected to the other series resonator 23b via the connecting terminal strip 29, while the other electrode is connected to the grounding terminal strip 27. Thus, the parallel resonator elements 24a and 24b are connected in parallel with each other with one of the electrode pairs connected between the series resonator elements 23a and 23b and the other electrode pair connected to the grounding terminal strip 27 to form a unitary filter circuit.

After arranging the components in position in the casing 21 to form the unitary filter circuit, the opening 22 of the casing 21 is covered with a sealing plate 34 and then the remaining space or recess above the sealing plate 34 is filled with a filling material 35 such as epoxy resin to tightly seal the casing 21. As will be seen in FIG. 9, the respective connector legs 25a, 26a and 27d of the input and output terminal plates 25 and 26 and the grounding terminal strip 27 are extended outwardly through the casing 21 and are bent twice along the respective lateral surfaces and the bottom surface so that the free ends of the connector legs terminate on the bottom surface of the casing 21 and therefore the unitary filter circuit can be mounted flatly on a print-circuit board not shown. The unitary filter circuit arrangement obtained in this way becomes ready for activation when the connector legs 25a, 26a and 27d of the input and output terminal plates 25 and 26 and the grounding terminal strip 27 located on the bottom surface of the casing 21 are electrically connected to respective connectors of the print-circuit board by a soldering. More particularly, as shown in FIG. 10, the series resonator elements 23a and 23b are connected in series with an input and output terminals 16 and 17 via the respective input and output terminal plates 25 and 26, while the parallel piezoelectric resonator elements 24a and 24b are connected in parallel with the grounding terminal 18. The illustrated filter circuit comprises two ladder-type electric filter devices having a similar configuration.

In the illustrated filter device, the series piezoelectric resonator elements 23a and 23b are rectangularly shaped and they have resonance frequency anti-resonance frequency in the longitudinal oscillation mode, respectively, which are set to the center frequency of the filter device. Since width of each of the rectangular resonator elements is less than a half of that of a square resonator or the diameter of a circular resonator, the height of the casing 21 can be significantly reduced. Moreover, since the input and output terminal plates 25 and 26 as well as the connecting terminal strips 28 and 29 are integrally formed with the casing 21 and rigidly secured thereto, the number of components that needs to be assembled is also significantly reduced.

As illustrated and described above, the series resonator elements 23a and 23b and the parallel resonator elements 24a and 24b have a rectangular form and are operated at the longitudinal oscillation mode, and the input and output terminal plates and the grounding terminal plates are integrally formed with the casing so that they are securely disposed in position within the casing. Moreover, the connecting legs of the input, output and connecting terminal plates are extended outwardly through the casing and rest on the bottom surface of the casing. Therefore, the number of components that needs to be assembled is significantly reduced to simplify the operation of assembling them and consequently lower the overall manufacturing cost. Because such filter device can be flatly mounted on a print-circuit board and the used resonator elements are rectangular, the overall height of the casing can be remarkably reduced.

With the illustrated embodiments, although the filter device comprises two series resonator elements and two parallel resonator elements, it is appreciated that filter device may be formed by two or more resonator elements.

As illustrated and described above, according to the present invention, by a provision of the specifically shaped and arranged resonator elements a very thin and down-sized ladder-type electric filter device can be provided. Such a filter device can significantly contribute to reduction of the size of a portable and mobile radio communication unit such as an automobile telephone set.

Furthermore, the present invention has an advantage that it is possible to reduce the number of parts necessary for assembling the filter device and to simplify the manufacturing thereof. This results in a cheaper device.

It is to be understood that the present invention in not restricted to the particular embodiments illustrated and that numerous modifications and alternations may be made by those skilled in the art without departing from the spirit and scope of the invention.

We claim:

1. A ladder-type electric filter device comprising a plurality of series piezoelectric resonator elements each having a strip shape and operated at a longitudinal oscillation mode, a plurality of parallel piezoelectric resonator elements each having a square shape and operated at a peripheral oscillation mode, an input and output terminal plates for electrically connecting said series and parallel resonator elements to form a predetermined connection type filter circuit and each having a connecting leg, and a casing having two compartments separated by a partition, one for containing said series piezoelectric resonator elements and the other for containing the parallel piezoelectric resonator elements, each of said series and parallel resonator elements being layered along the height of the casing.

2. A ladder-type electric filter device according to claim 1, wherein each of said strip-shaped series piezoelectric resonator elements has a main resonance frequency equal to the center frequency of the filter, and each of said parallel piezoelectric resonator elements has an anti-resonance frequency equal to the center frequency of the filter.

3. A ladder-type electric filter device according to claim 1, wherein each of said strip-shaped series piezoelectric resonator elements has a thickness larger than and a surface area smaller than that of each of said parallel piezoelectric resonator elements.

4. A ladder-type electric filter device according to claim 1, wherein each of said strip-shaped series piezoelectric resonator elements has a thickness equal to that of each of said parallel piezoelectric resonator elements.

5. A ladder-type electric filter device according to claim 4, wherein each of said strip-shaped series piezoelectric resonator elements is provided with a partial electrode on a portion of one surface thereof.

6. A ladder-type electric filter device according to claim 1, wherein the connecting legs of said input and output terminal plates have respectively free ends extended on the bottom of said casing.

7. A ladder-type electric filter device including a plurality of series and parallel piezoelectric resonator elements each having a rectangular form and being operated at a longitudinal oscillation mode, an input, output, grounding and connecting terminal plates for electromechanically holding said piezoelectric resonator elements, and a casing for containing said series and parallel piezoelectric resonator elements and said respective terminal plates to form a predetermined connection type filter circuit, said input, output and grounding terminal plates being arranged within and integrally formed with said casing so that they are rigidly fitted thereto, and each of said input, output and grounding terminal plates being provided with a connecting leg which is extended to the outside of the casing and is bent toward the bottom of the casing.

8. A ladder-type electric filter device according to claim 7, wherein each of said series piezoelectric resonator elements has a main resonance frequency equal to the center frequency of the filter, and each of said parallel piezoelectric resonator elements has an anti-resonance frequency equal to the center frequency of the filter.

9. A ladder-type electric filter device according to claim 7, wherein each of said series piezoelectric resonator elements has a thickness larger than and a surface area smaller than that of each of said parallel piezoelectric resonator elements.

10. A ladder-type electric filter device according to claim 7, wherein each of said series piezoelectric resonator elements has a thickness equal to that of each of said parallel piezoelectric resonator elements.

11. A ladder-type electric filter device according to claim 7, wherein each of said series piezoelectric resonator elements is provided with a partial electrode on a portion of one surface thereof.

* * * * *